(12) United States Patent
Edwardson et al.

(10) Patent No.: US 8,540,422 B2
(45) Date of Patent: Sep. 24, 2013

(54) ELECTRICAL COMPONENT BEHAVIOR ANALYSIS TOOLS

(75) Inventors: Jason J. Edwardson, San Clemente, CA (US); Timothy A. Fonte, San Francisco, CA (US); Eric F. King, Santa Ana, CA (US); Ross G. Baker, Jr., Bellaire, TX (US); Toby Daniel Awender, Mission Viejo, CA (US)

(73) Assignee: Cameron Health, Inc., Sam Clemente, CA (US)

( * ) Notice: Subject to any disclaimer, the term of this patent is extended or adjusted under 35 U.S.C. 154(b) by 355 days.

(21) Appl. No.: 12/897,496

(22) Filed: Oct. 4, 2010

(65) Prior Publication Data
US 2012/0082180 A1    Apr. 5, 2012

(51) Int. Cl.
*G01K 7/00* (2006.01)
*G01K 3/06* (2006.01)
*G01R 31/02* (2006.01)
*G01N 25/20* (2006.01)

(52) U.S. Cl.
USPC ........... 374/152; 374/178; 374/141; 374/137; 374/5; 374/1; 324/500; 702/130; 702/99

(58) Field of Classification Search
USPC ............. 374/4, 5, 1, 141, 152, 163, 170–173, 374/178, 183, 185, 100, 137; 702/130, 132–136, 99; 327/512, 513; 324/500, 512, 522, 525, 527, 519, 754.01–754.03, 324/754.08, 756.01–756.03, 763.01
See application file for complete search history.

(56) References Cited

U.S. PATENT DOCUMENTS

| | | | |
|---|---|---|---|
| 5,154,793 A | 10/1992 | Wojnarowski et al. | |
| 5,414,370 A * | 5/1995 | Hashinaga et al. | 324/750.07 |
| 5,801,540 A | 9/1998 | Sakaguchi | |
| 5,847,366 A * | 12/1998 | Grunfeld | 219/497 |
| 6,008,488 A | 12/1999 | Jarvis et al. | |
| 6,140,811 A | 10/2000 | Little | |
| 6,244,753 B1 | 6/2001 | O'Connor et al. | |
| 6,549,022 B1 | 4/2003 | Cole, Jr. et al. | |
| 6,552,561 B2 * | 4/2003 | Olsen et al. | 324/750.06 |
| 6,786,639 B2 * | 9/2004 | Covi et al. | 374/178 |
| 6,996,491 B2 * | 2/2006 | Gold et al. | 702/132 |
| 7,296,928 B2 * | 11/2007 | Bowden et al. | 374/163 |
| 7,538,557 B2 | 5/2009 | DeHaven | |
| 7,549,795 B2 * | 6/2009 | Kosta et al. | 374/170 |
| 7,667,474 B2 | 2/2010 | Sunohara et al. | |
| 7,813,815 B2 * | 10/2010 | Ainspan et al. | 700/2 |
| 8,272,781 B2 * | 9/2012 | Nale | 374/178 |
| 8,299,393 B2 * | 10/2012 | Kelly et al. | 219/121.63 |
| 2006/0221741 A1 * | 10/2006 | Jain et al. | 365/211 |
| 2006/0263912 A1 * | 11/2006 | Arroyo et al. | 438/14 |

* cited by examiner

*Primary Examiner* — Gail Verbitsky
(74) *Attorney, Agent, or Firm* — Schwegman Lundberg & Woessner, P.A.

(57) ABSTRACT

Tools and methods for creating isolated or localized temperature changes on components in an electric circuit. By isolating temperature changes to individual components or small sets of components, the tools and methods allow greater control over the analysis of interactions within a board. This may allow clearer understanding of the effects of temperature on circuit component behavior. The tools and analysis advances analysis such as failure analysis and design testing.

7 Claims, 6 Drawing Sheets

ELECTRICAL COMPONENT BEHAVIOR ANALYSIS TOOLS

FIELD

The present invention is related to the field of electronics. More particularly, the present invention relates to the analysis of component behavior including temperature effects.

BACKGROUND

In the field of electronics it is well known that component characteristics can vary with temperature. When investigating the behavior of an electrical circuit, the interaction of temperature-related variability of components can become very complex. For example, a circuit that functions predictably at one temperature may become unpredictable at a different temperature.

Referring to the example circuit 10 of FIG. 1, various components of different types are included in the circuit 10, such as components shown at 12, 14, 16, 18 and 20. The behavior of any individual component at a first temperature may change at a second temperature. When investigating function, and particularly, failure, of a circuit such as that shown at 10, changes to one component 12 may be opposite of changes of another component 14, creating complex interactions. If the circuit 10 is not operating as expected, the complexity of temperature interactions in the circuit 10 may quickly render analysis quite difficult in the face of an unknown failure mode.

Figure 1:
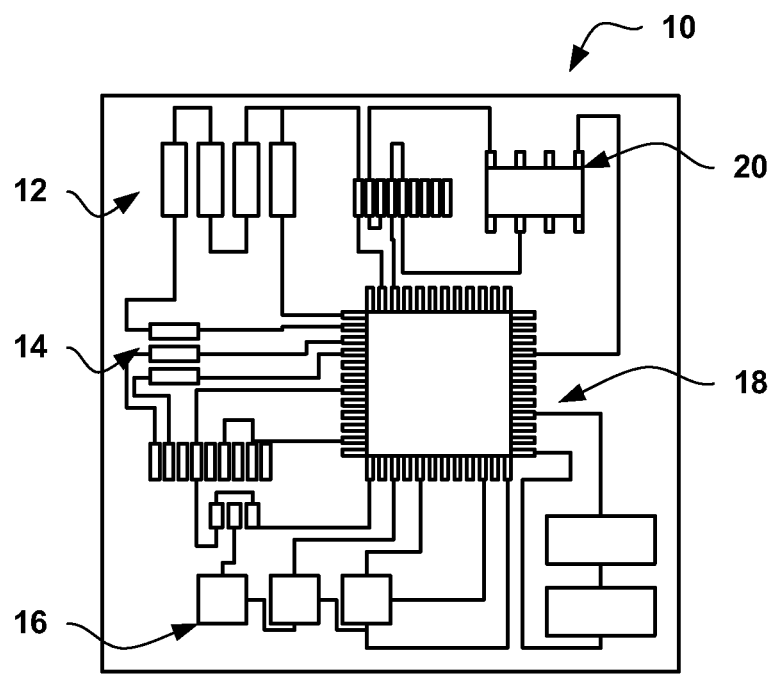
Figure 2:
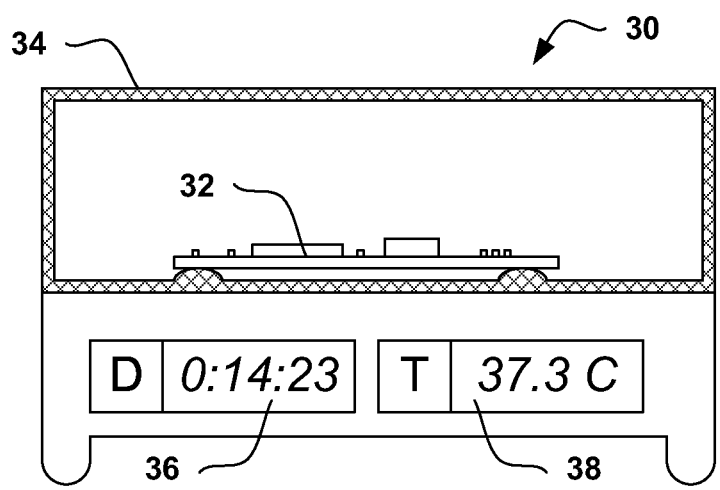
Figure 3A:
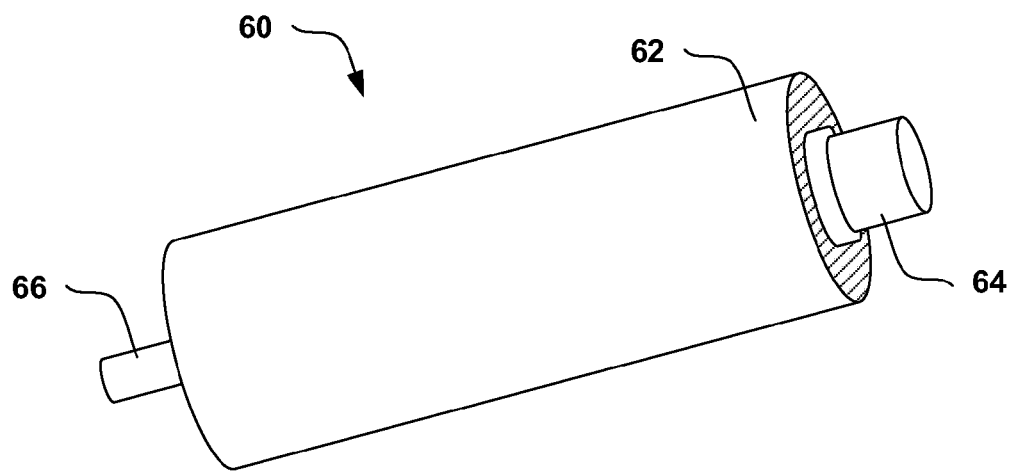
Figure 3B:
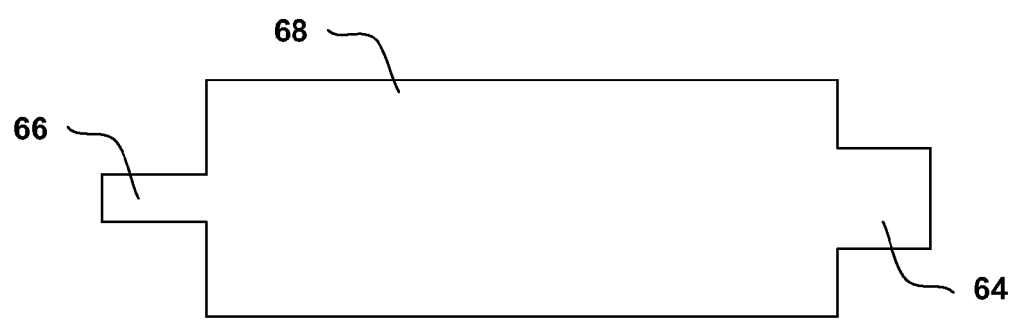

A typical manner of observing temperature effects on circuit operation is shown by FIG. 2. An oven 30 is used to control the temperature on circuit board 32. The circuit board 32 is placed in a chamber 34 having a controlled environment. Typical controls include dwell time 36 and temperature 38, as well as humidity (not shown). Probes may be placed on the circuit board 32 to observe voltages on traces or across components. Because the entire circuit board 32 is subjected to a single environmental condition, however, the complex interaction of parts and their changes in response to temperature is not fully observable.

Improved and alternative devices and methods for manipulating temperature control in circuit analysis are desired.

SUMMARY

The present invention provides tools and methods for creating isolated or localized temperature changes on components in an electric circuit. By isolating temperature changes to individual components or small sets of components, the tools and methods allow greater control over the analysis of interactions within a board. This may allow clearer understanding of the effects of temperature, advancing such analysis as failure analysis and design testing. Additional embodiments may include cooling or heating an entire circuit, circuit board or substrate and then creating isolated or localized temperature changes to further analysis.

BRIEF DESCRIPTION OF THE DRAWINGS

FIG. 1 is a drawing of a circuit board;

FIG. 2 illustrates a prior art manner of observing temperature effects on circuit operation;

FIGS. 3A-3B show details of a passive component temperature manipulation tool;

FIG. 4 shows use of the tool of FIGS. 3A-3B;

FIG. 5 illustrates another component temperature manipulation tool;

FIG. 6 shows use of the tool of FIG. 5; and

FIG. 7 shows another example of a tool in accordance with another embodiment.

DETAILED DESCRIPTION

The following detailed description should be read with reference to the drawings. The drawings, which are not necessarily to scale, depict illustrative embodiments and are not intended to limit the scope of the invention. Some of the following examples and explanations include references to issued patents and pending patent applications. These references are for illustrative purposes and are not intended to limit the present invention to the particular methods or structures from the referenced patents and patent applications.

FIG. 1 is a drawing of a circuit board. Circuit boards are widely known for use in electronics of all sorts. The typical circuit board comprises a substrate having a plurality of components 12, 14, 16, 18, 20 thereon, with traces (electrically conductive lines) connecting the components. FIG. 2 illustrates a prior art manner of observing temperature effects on circuit operation. Often it is the case that a circuit board is expected to operate at some predetermined temperature range. For example, implantable medical devices spend much of their operational lives in a body-temperature (approximately 37 degrees C.) environment. Additional variables such as humidity, pressure and cleanliness may also be controlled. Testing is sometimes performed in an oven 30. The circuit board 32 is placed in a chamber 34 for a predetermined duration 36 at a given temperature 38. The complex shortcomings of this approach for analyzing function and/or failure are introduced in the Background section, above.

FIGS. 3A-3B show details of a passive component temperature manipulation tool. As shown in FIG. 3A, the tool 60 comprises a body section 62 sized for ready grasping, and two ends 64, 66. The ends 64, 66 each include an extension, with the extension at end 64 being larger in diameter and the extension at 66 being smaller in diameter. As highlighted by FIG. 3B, the central portion of the tool 60 includes a larger diameter section 68 with the two extensions 64, 66. The material of the portion shown in FIG. 3B may be, for example, brass, or other copper based alloy having high thermal conductivity. Other materials may be used instead. In one working example, the ends 64, 66 were formed by removing material from the ends of a brass bar. The ends 64, 66 may be coated with an electrically isolative layer such as an epoxy coating. Other heat-transferring dielectrics may be used at ends 64, 66; in one illustration a diamond tip can be provided for high thermal transfer and strong dielectric characteristics.

Referring again to FIG. 3A, the body section 62 may be covered with a thermal and electrical isolator, such as a layer of rubber, leather or plastic. This protects a user from heat and/or electricity that may pass through the tool 60. In one example a layer of Kapton® was used to isolate much of the tool 60. In use, the entire tool 60 is placed in an oven or on a hot plate prior to use. After a period of time, typically thirty (30) seconds up to five (5) minutes, allowing it to be warmed, the tool 60 can be used as shown in FIG. 4.

FIG. 4 shows use of the tool of FIGS. 3A-3B. A circuit board 80 is shown with a number of components 84, 86, 88. The tool 82, having previously been heated, is placed in contact with one of the components 84. A probe 90 is coupled to traces, components or pins on the circuit board 80 to allow observation of, for example, the voltage across a component on the circuit board 80. Other suitable ways to use the probe 90 may include cutting a trace and bridging the open trace with the probe 90, or removing a component on the circuit board 80, for example, to analyze current flow and/or to monitor the circuit's response to selected conditions.

As the tool 82 transfers heat energy to the component 84, characteristics of the component 84 may change. For example, the circuit design may call for component 84 to operate in a narrow range of parameters (resistance, capacitance, etc.) across a temperature variation such that by heating the component 84 in isolation of the rest of the circuit board 80, the analysis can show that the specific component 84 is or is not meeting its design requirements. The method may include iterative testing of individual components. For example, after observing any changes in operational characteristics of the circuit board 80 while component 84 is at an elevated temperature, the tool 82 is moved (and re-heated, if necessary) to components 86 and 88 to allow further testing.

In some embodiments the tool 82 is heated to any suitable temperature. For example, the probe 82 may be heated to one-hundred (100) degrees C. In other embodiments, the circuit board 80 is designed for use in special applications such as medical implants, and the tool 82 is heated accordingly, for example to a range near that of body temperature. Thus, with body temperature typically at about thirty-seven (37) degrees C., the tool 82 may be heated in the range of thirty-five to forty-five (35-45) degrees C.

In some embodiments, the circuit board 80 may be placed in a temperature controlled space for cooling or heating to a desired temperature, and the tool 82 can then be used to create localized temperature changes on individual components. For example, the board 80 could be heated to body temperature or operational temperature, and a component on the board 80 would then be heated or cooled using the tool 82. In another example, the board 80 could be cooled to a desired temperature to test particular conditions (transport or extreme weather, for example) while heating one or more components with the tool 82.

Figure 4:
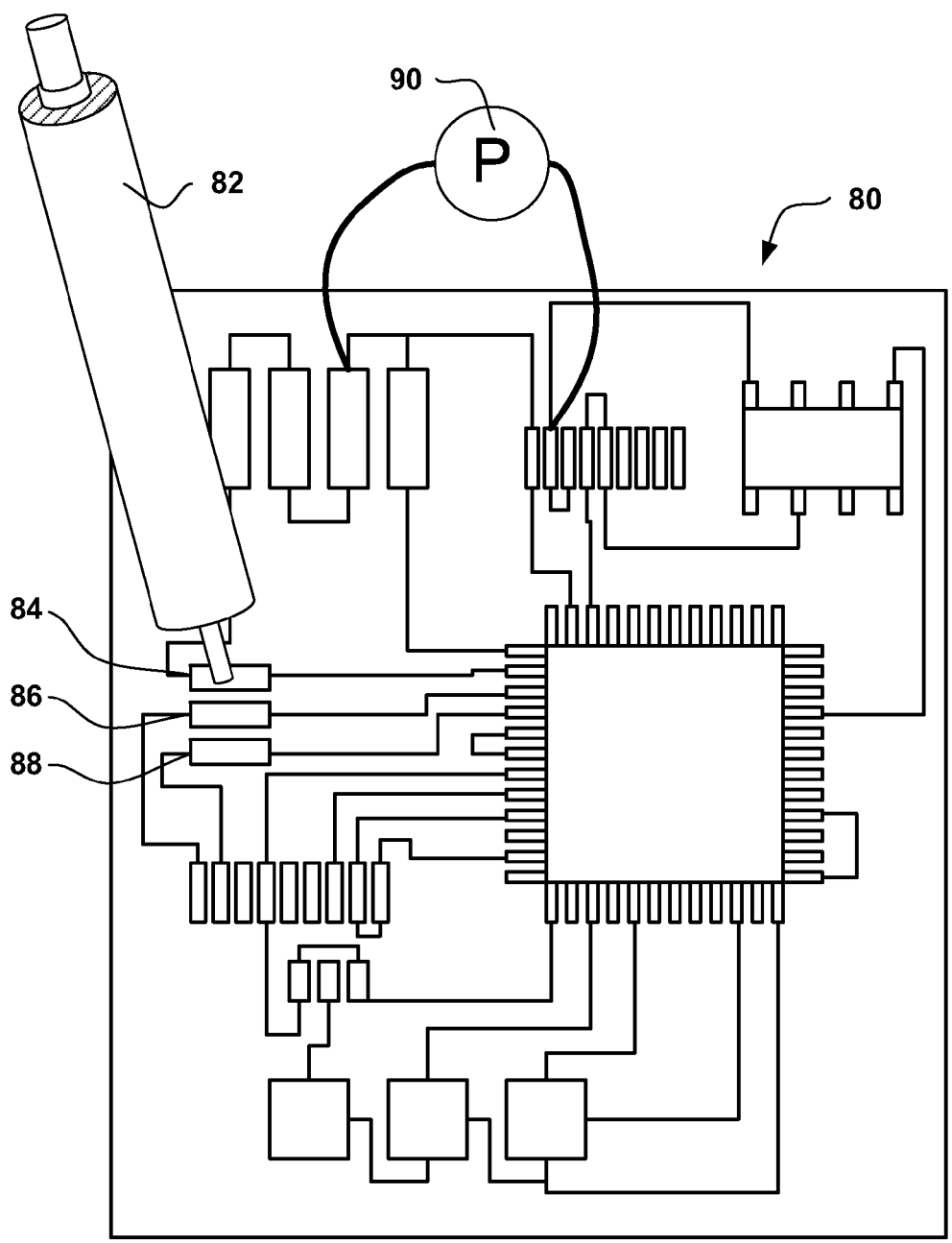

The use of tool 82 may avoid problems with hot-air guns, which can disturb cleanliness and may not provide predictable or immediate behavior since air is an indirect heat transfer mechanism. Likewise, infrared light tools could be used to warm individual components, but these bring their own problems, for example, if components are light-sensitive. Further, infrared light tools can be difficult to use in some environments. The direct contact mechanism shown in FIG. 4 provides easy control over which component is heated.

In an alternative embodiment, the entire board 80 is heated, and the tool 82 is cooled, and the reverse process noted above is used. Other combinations of heating or cooling the entire board 80 while using the probe for cooling or heating as noted above may be used as well. Again, variation in response of components 84, 86, 88 can be measured by repeatedly cooling different parts of the circuit while monitoring circuit operation.

If desired, more than one tool 82 may be used to allow multiple isolated components to be heated/cooled.

Figure 5:
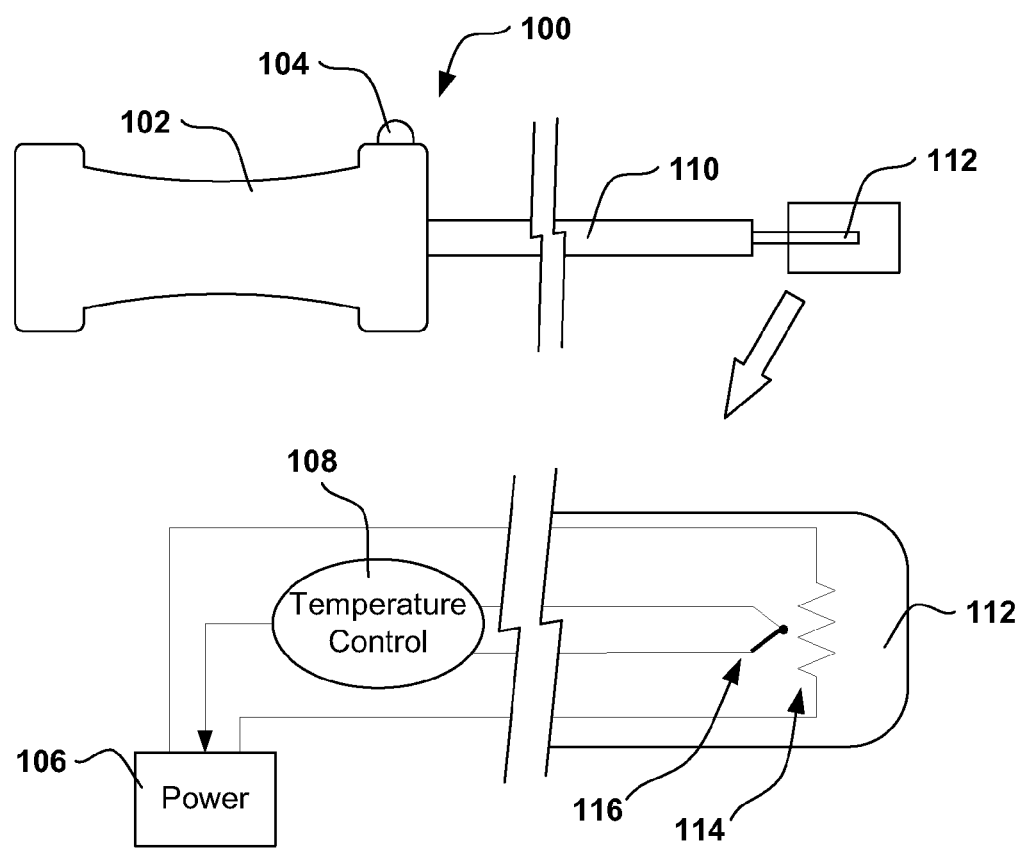

FIG. 5 illustrates another component temperature manipulation tool. The tool 100 includes a handle 102 having an actuator 104. The actuator 104 is shown as a button and may be, for example, an on-off switch. Alternatively, a slider or knob having on/off settings and/or multiple settings (Off, Low, High) may be used as actuator 104. The actuator 104 may allow a specific temperature to be selected as well. A continuously variable control, such as a continuous knob or slider, can also be used. Other designs and locations for the actuator 104 may be used.

The handle 100 is attached to an elongate probe section 110 that terminates in a probe tip 112. The detail view in FIG. 5 shows that at the probe tip 112 a heating element 114 and a thermocouple 116 are provided. The heating element 114 is shown as a resistive heating element; any other suitable component may be used in place of the resistor shown, such as an inductive heating element. Rather than a thermocouple 116, any suitable heat-sensing component may be used. In one example, a thermister is used, combining the functionality of both the heating element 114 and thermocouple 116. The combination of heating element and temperature sensor (thermocouple 116 is an example) provides closed loop control over the system. A thermal insulator may be used to insulate the rest of the elongate probe section 110 from the probe tip 112, enhancing temperature control and isolation. In one example, a Kapton® insulator may be used to isolate elongate probe section 110 from probe tip 112. An epoxy or other dielectric coating may be used over the probe tip 112. These features may be optionally included in any embodiment of the present invention.

A power supply 106 and temperature control circuit 108 are used to control the temperature of the probe tip 112 by coupling with the heating element 114 and thermocouple 116. Temperature control may be effected, for example, using a system as simple as a comparator and reference voltage or potentiometer, with the output from the thermocouple fed (possibly through amplification circuitry) to one input to the comparator and a reference voltage being determined using the actuator 104. More complex systems of temperature control are well known, using for example simple controllers.

An analog or digital temperature readout may be provided on the tool 100, if desired. Ready/not ready lights may be provided, too. The handle 102 may contain batteries that act as the power supply 104. In an alternative embodiment, line power may be used instead. A hazard or warning indicator, such as a light, may also be provided to indicate that the probe tip 112 is too hot to touch.

The temperature output, again, may vary in a wide range depending upon the desired application and use of the underlying circuit. In some examples, the temperature control 106 is designed for a range near that of body temperature for circuits directed to involve implantable medical devices.

In another embodiment, rather than a heating element 114, a cooling element may be provided, for example using a Peltier cooling circuit. A Peltier cooling circuit may, for example, heat the body 110 of the tool while cooling the tip 112. Any suitable thermoelectric circuit can be used to modify or control the temperature of the tip 112. To this end, the thermocouple 116 (or other temperature sensing component) may be integrated into the tip 112 while the heating or cooling element 114 is coupled closer to the body 110, in a configuration that is reversed from what is shown in the detail view of FIG. 5.

Figure 6:
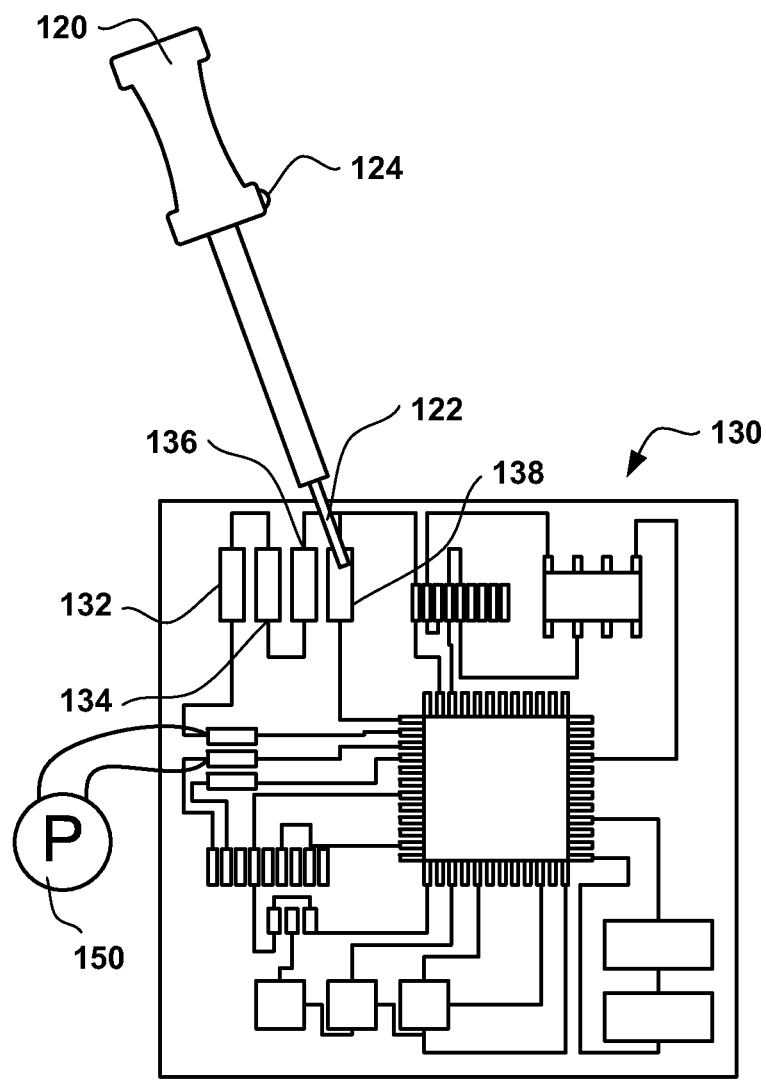

FIG. 6 shows use of the tool of FIG. 5. A tool 120 is shown relative to circuit board 130. The tool 120 includes a tool tip 122. To begin analysis of the circuit, the tool tip 122 is heated by the operation of the tool 120 in response to a user depressing the actuator 124. The tool tip 122 is brought into contact with a desired one of the components 132, 134, 136, 138 on the circuit board 130. The operational characteristics of the circuit board are monitored as the tool tip 122 is used to separately and independently heat the components 132, 134, 136, 138. Again a separate probe 150 may be used to observe circuit operation or, alternatively, the outputs of the circuit board 130 may be monitored.

Figure 7:
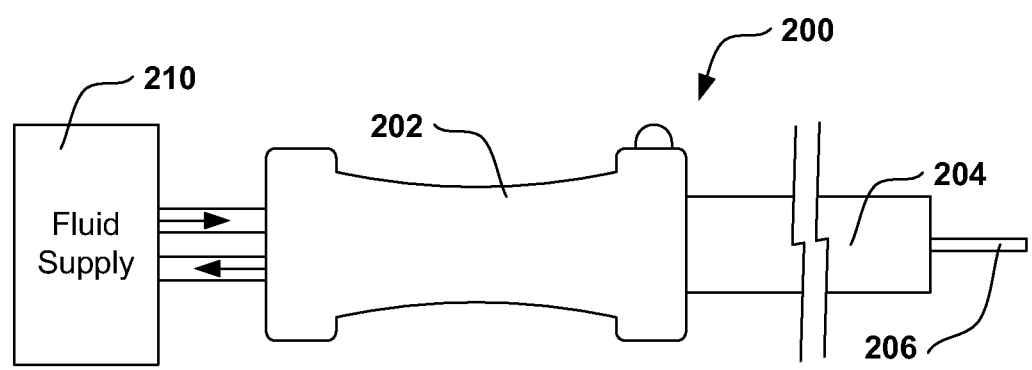

FIG. 7 shows another example of a tool in accordance with another embodiment. In this example, a tool 200 is provided with a handle 202, elongated body 204 and tip 206. The tool 200 is coupled to a fluid supply 210 which can circulate cooling or heating fluid to the tool 200. In accordance with this example, the tool 200 includes channels (not shown) in the elongated body 204 for circulating the cooling or heating fluid to control the temperature of the tip 206. Temperature control may be integrated into the fluid supply 210 or can be part of the tool 200. For example, the tool 200 may passively circulate fluid from fluid supply 210, or it may modulate fluid flow in response to detected temperature at/near the tip 206.

Those skilled in the art will recognize that the present invention may be manifested in a variety of forms other than the specific embodiments described and contemplated herein. Accordingly, departures in form and detail may be made without departing from the scope and spirit of the present invention.

What is claimed is:

1. A method of performing circuit analysis on a circuit comprising at least first and second electrical components, the method comprising:
   a) providing power to at least a portion of the circuit;
   b) monitoring a characteristic of operation of the circuit;
   c) manipulating a temperature of a component analysis tool;
   d) placing the temperature-manipulated component analysis tool relative to the first component to modify a temperature of the first component while not modifying a temperature of the second component;
   e) observing whether the characteristic of operation of the circuit changes in response to temperature modification of the first component of the circuit;
   f) placing the temperature-manipulated component analysis tool relative to the second component to modify a temperature of the second component while not modify a temperature of the first component;
   g) observing whether the characteristic of operation of the circuit changes in response to temperature modification of the second component; and
   h) comparing any observed changes in the characteristic of operation of the circuit in response to modifying the temperature of the first component to any observed changes in the characteristic of operation of the circuit and in response to modifying the temperature of the second component.

2. The method of claim 1 wherein the circuit is disposed on a circuit board and the method further comprises pre-heating the circuit board to a desired temperature before performing at least steps b)-e).

3. The method of claim 2 wherein the step of manipulating the temperature of the component analysis tool includes cooling the component analysis tool to a temperature below the desired temperature.

4. The method of claim 2 wherein the step of manipulating the temperature of the component analysis tool includes heating the component analysis tool to a temperature above the desired temperature.

5. The method of claim 1 wherein the circuit is disposed on a circuit board and the method further comprises pre-cooling the circuit board to a desired temperature before performing at least steps b)-e).

6. The method of claim 5 wherein the step of manipulating the temperature of the component analysis tool includes cooling the component analysis tool to a temperature below the desired temperature.

7. The method of claim 5 wherein the step of manipulating the temperature of the component analysis tool includes heating the component analysis tool to a temperature above the desired temperature.

* * * * *

UNITED STATES PATENT AND TRADEMARK OFFICE
CERTIFICATE OF CORRECTION

| | | |
|---|---|---|
| PATENT NO. | : 8,540,422 B2 | |
| APPLICATION NO. | : 12/897496 | |
| DATED | : September 24, 2013 | |
| INVENTOR(S) | : Edwardson et al. | |

It is certified that error appears in the above-identified patent and that said Letters Patent is hereby corrected as shown below:

On the title page, item (73), in "Assignee", in column 1, line 1, delete "Sam" and insert --San--, therefor Signed and Sealed this
Eighteenth Day of February, 2014

Michelle K. Lee
*Deputy Director of the United States Patent and Trademark Office*